United States Patent
Ueno

Patent Number: 5,879,843
Date of Patent: Mar. 9, 1999

[54] METHOD OF REDUCING REGISTRATION ERROR IN EXPOSURE STEP OF SEMICONDUCTOR DEVICE

[75] Inventor: Atsushi Ueno, Hyogo, Japan

[73] Assignee: Mitsubishi Denki Kabushiki Kaisha, Tokyo, Japan

[21] Appl. No.: 7,362

[22] Filed: Jan. 15, 1998

Related U.S. Application Data

[62] Division of Ser. No. 653,146, May 24, 1996, Pat. No. 5,731,113.

[30] Foreign Application Priority Data

Dec. 22, 1995 [JP] Japan ................................. 7-334794

[51] Int. Cl.$^6$ ................................................. G03F 9/00
[52] U.S. Cl. ............................ 430/22; 430/30; 356/399; 356/401
[58] Field of Search .................... 430/22, 30; 356/399, 356/401

[56] References Cited

U.S. PATENT DOCUMENTS

| | | | |
|---|---|---|---|
| 5,444,538 | 8/1995 | Pellegrini | 356/401 |
| 5,468,580 | 11/1995 | Tanaka | 430/22 |
| 5,656,402 | 8/1997 | Kasuga | 430/22 |

*Primary Examiner*—Christopher G. Young
*Attorney, Agent, or Firm*—McDermott, Will & Emery

[57] ABSTRACT

A method of reducing a registration error is provided in which the registration error can be uniformly distributed even if an amount of displacement is larger than others at only one of a plurality of measuring points. According to the method, amounts of displacement are measured first at a plurality of measuring points, then one half the sum of the maximum value and the minimum value of the measured amounts of displacement is calculated to obtain a correction value. The correction value is fed back to an exposure apparatus as a correction value for an exposure condition setting file within the exposure apparatus used in an exposure step. The registration error can be distributed uniformly even if amounts of displacement at a plurality of measuring points are considerably different from each other.

2 Claims, 5 Drawing Sheets

SHIFT AMOUNT (OFFSET AMOUNT)

METHOD OF REDUCING REGISTRATION ERROR IN EXPOSURE STEP OF SEMICONDUCTOR DEVICE

This application is a Divisional of application Ser. No. 08/653,146 filed May 24, 1996, U.S. Pat. No. 5,731,113.

BACKGROUND OF THE INVENTION

1. Field of the Invention

The invention relates to a method of reducing a registration error and, more particularly to a method of reducing a registration error in an exposure step of a process for manufacturing a semiconductor device.

2. Description of the Background Art

As a pattern of a semiconductor device is miniaturized, the demand for registration accuracy in a photolithography step is increasing. For example, the design rule which refers to the minimum size in the design of a 64MDRAM (Dynamic Random Access Memory) is approximately 0.30–0.35 $\mu$m. The registration accuracy required for this design rule is 0.08 $\mu$m or less.

FIG. 3 is a perspective view illustrating a conventional exposure apparatus. Referring to FIG. 3, the conventional exposure apparatus is provided with a wafer 101 on a wafer stage 100 which is movable in the X-Y directions. A demagnification projection lens 103 is provided above wafer 101, and a reticle 104 with a patterned layer is placed above demagnification projection lens 103. Using the exposure apparatus of above described structure, a pattern corresponding to the pattern image of reticle 104 is formed on the surface of wafer 101. A shot 102 having one pattern which corresponds to the pattern image of reticle 104 is formed on wafer 101 by an exposure, and a plurality of shots 102 are formed on wafer 101 by repeating the exposure.

An alignment at the time of exposure by the conventional exposure apparatus is performed by moving wafer stage 100 according to an array of shots 102 in the layer pattern (not shown) formed on wafer 101 in the previous step. A general method conventionally used for recognizing the array of shots 102 is EGA (Enhanced Global Alignment). According to this EGA method, the state of placement of some of those shots 102 on wafer 101 is determined by measuring the positions of the marks for registration (alignment marks) provided in the shots 102. The array state of all the remaining shots 102 is accordingly examined. Based on the result, an alignment exposure is executed.

Conventionally, after an exposure according to EGA, an amount of displacement of shot 102 was measured by an alignment inspection device. The amount of displacement means an amount of shift (offset) in the X and Y directions as shown in FIG. 4. For measuring the amount of displacement, marks for inspection of misalignment (not shown) are first arranged in four corners of shot 102. Then, a relative amount of displacement between the first misalignment inspection marks of the first layer pattern formed in the previous step and the second misalignment inspection marks of the second resist pattern formed on the second layer on the first layer pattern is image-processed by a CCD camera, whereby the amount of displacement is calculated. An average value of the amounts of displacement at the four corners of shot 102 was conventionally used as an amount of displacement of shot 102.

If all the shots 102 are determined to be uniformly shifted in the same direction as a result of above inspection by the conventional alignment inspection device, it is understood that a correction for the offset amount was necessary beforehand in the exposure step according to EGA. That is, EGA requires a correction of the amount measured in EGA method in accordance with the positions of the marks for registration (alignment marks) or the production error of a reticle. Feeding back this correction value into an exposure condition setting file within the exposure apparatus, an offset error could be zero when the same exposure step as above will be next performed.

With reference to FIG. 5, conventional ways of calculating and feeding back a correction value will be described in the following.

Referring to FIG. 5, a first layer is formed on a semiconductor substrate (not shown) in S1 (Step 1). In S2, a first resist is applied to the first layer. Next, the applied first resist is exposed by a first exposure apparatus in S3. In S4, a first resist pattern is then formed by developing the exposed first resist. In S5, the first layer is patterned by etching using the first resist pattern thereon as a mask, thereby forming a first layer pattern. Next, a second layer is formed on the first layer pattern in S6. A second resist is then applied to the second layer in S7. In S8, the second resist is exposed by a second exposure apparatus. In S9, a second resist pattern is formed by developing the exposed second resist.

Subsequently, amounts of displacement between the first layer pattern and the second resist pattern are measured at four points (in four corners of a shot) in S10. A determination is made in S11 whether at least one of the four measured amounts of displacement is a prescribed value or more. If all the amounts of displacement are less than the prescribed value, next in S12, a second layer pattern is formed by etching the second layer using the second resist pattern thereon as a mask.

On the other hand, if at least one of the amounts of displacement is determined to be the prescribed value or more, a correction value is calculated and a second resist is formed again. The correction value is determined by firstly calculating an average value of the four measured amounts of displacement as shown in S15. Secondly the determined correction value is fed back to the second exposure apparatus in S8. After above steps, a second resist is formed again. According to the re-formation step of the second resist, the second resist pattern is first removed in S14, then the new second resist is applied again to the second layer in S7.

In the conventional method described above, if an amount of displacement between the first layer pattern and the second resist pattern is a prescribed value or more, a correction value is calculated and the value is fed back to the second exposure apparatus, then the defective second resist pattern is removed and a second resist pattern is newly formed by applying a new second resist to the second layer.

According to the conventional method for exposing a plurality of layers, in some cases an exposure apparatus (first exposure apparatus) employed for a pattern formation (first resist pattern formation) in the previous step is different from an exposure apparatus (second exposure apparatus) employed for a pattern formation (second resist pattern formation) in the following step.

Under above described condition in which a plurality of different exposure apparatuses (steppers) are alternately used, shapes of shots produced by respective exposure apparatuses may be different from each other due to the difference of lens distortion or the like between respective exposure apparatuses. FIG. 6 is a schematic illustration of an exemplary shape of a shot when different exposure apparatuses are employed for the first layer and the second layer. Referring to FIG. 6, the shape of the shot of a first layer pattern 1 is approximately rectangular, while the shape of the shot of a second resist pattern 2 is trapezoidal. As a result, when amounts of displacement between the first layer pattern 1 and the second resist pattern 2 are measured at four measuring points 3 according to S10 of FIG. 5, only an amount of displacement "a" in the X direction at the measuring point in the upper right corner is measured. This result also occurs even when a single exposure apparatus is employed, due to the change of an exposure illumination condition.

According to the conventional method of calculating a correction value shown in S15 of FIG. 5, an average value $(0+0+0+a) \times \frac{1}{4} = a/4$ of the four amounts of displacement at the four corners of the shot is computed as a correction value. The correction value is fed back to the second exposure apparatus as an offset correction value upon the next exposure. The result of an alignment inspection after the exposure by the second exposure apparatus with the correction value fed back is as shown in FIG. 7. An average value of the amounts of displacement at the four corners of the shot is $(-a/4-a/4-a/4+3a/4) \times \frac{1}{4} = 0$. However, amounts of displacement at respective measuring points in the shot are $-a/4, -a/4, -a/4, +3a/4$, which means that there is left a point with an amount of displacement of at most $3a/4$ in absolute value. If any of the amounts of displacement has such a larger value, various problems such as an electrical short, caused, for example, by a shift of a pattern of a contact hole, will occur. Such problems have become serious with the increasing miniaturization of a semiconductor pattern.

SUMMARY OF THE INVENTION

An object of the invention is to provide a method of reducing a registration error which can be applicable even if requirement for registration accuracy is severe.

Another object of the invention is to provide a method of reducing a registration error which can reduce the registration error if one of a plurality of measuring points has a large amount of displacement.

A method of reducing a registration error according to an aspect of the invention is the one used in an exposure step of a process of manufacturing a semiconductor device. According to this method, after amounts of displacement are measured at a plurality of measuring points, one half the sum of the maximum and the minimum values of those measured amounts of displacement is calculated to obtain a correction value. The correction value is employed as a correction value for an exposure apparatus used in the exposure step. Thus, this method allows the effectively reduced registration error even if an amount of displacement at one of a plurality of measuring points is noticeably larger than others, since the larger amount can be distributed over the entire shot.

In a method of reducing a registration error according to another aspect of the invention, a first layer is formed on a first semiconductor substrate. A first resist is formed on the first layer. A first resist pattern with a plurality of first misalignment inspection marks is provided by exposing a prescribed area of the first resist using a first exposure apparatus. A first layer pattern with the first misalignment inspection marks is formed by patterning the first layer using the first resist pattern as a mask. A second layer is formed on the first layer pattern. A second resist is formed on the second layer. A second resist pattern with a plurality of second misalignment inspection marks corresponding to the plurality of first misalignment inspection marks is provided by exposing a prescribed area of the second resist utilizing a second exposure apparatus. Amounts of displacement between the first misalignment inspection marks of the first layer pattern and the second misalignment inspection marks of the second resist pattern are measured at a plurality of measuring points. A correction value is obtained by calculating one half the sum of the maximum and the minimum values of the amounts of displacement at the plurality of measuring points. The correction value is then fed back to the second exposure apparatus. According to the method described above, an amount of displacement is more effectively distributed over the entire shot when the amount at only one of the measuring points is extremely large, compared with the case in which an average value of the amounts of displacement at a plurality of measuring points is used as a correction value, since a correction value is obtained by calculating one half the sum of the maximum and the minimum values of the amounts of displacement at a plurality of measuring points and the correction value is fed back to the second exposure apparatus. Thus registration error can be effectively reduced. In addition to those steps according to the aforementioned another aspect of the invention, steps of successively forming a first layer pattern on a second semiconductor substrate then forming a second resist thereon and a step of forming a second resist pattern by exposing the second resist using the second exposure apparatus with the correction value fed back may be provided.

In a method of reducing a registration error according to still another aspect of the invention, a first layer is formed on a first semiconductor substrate. A first resist is formed on the first layer. A first resist pattern with a plurality of first misalignment inspection marks is provided by exposing a prescribed area of the first resist using a first exposure apparatus. A first layer pattern with the first misalignment inspection marks is provided by patterning the first layer using the first resist pattern as a mask. A second layer is formed on the first layer pattern, then a second resist is formed on the second layer. A second resist pattern with a plurality of second misalignment inspection marks corresponding to the plurality of first misalignment inspection marks is provided by exposing a prescribed area of the second resist using a second exposure apparatus. Amounts of displacement between the first misalignment inspection marks of the first layer pattern and the second ones of the second resist pattern are measured at a plurality of measuring points. It is determined whether at least one of the absolute values of the measurements at the plurality of measuring points is a prescribed value or more. If a measurement is determined to be equal or larger than a prescribed value, a correction value is obtained by calculating one half the sum of the maximum and the minimum values of the measurements, then the correction value is fed back to the second exposure apparatus. According to this method, a correction value can be calculated such that a large amount of displacement at one of a plurality of measuring points would be distributed over the entire shot, since it is determined whether at least one of absolute values of measurements of the amounts of displacement at a plurality of measuring points is less than a prescribed value, then one half the sum of the maximum and the minimum ones of the measured values is fed back to the second exposure apparatus as a correction value if at least one of the absolute values thereof is determined to be a prescribed value or more. Thus, amounts of displacement can be more effectively reduced. In addition to above described steps of the method according to the aforementioned still another aspect of the invention, steps of successively forming a first layer pattern on a second semiconductor substrate then forming a second resist thereon, and a step of forming the second resist pattern by exposing the second resist using the second exposure apparatus with a fed back correction value may be provided. In addition to above described steps of the method according to the still another aspect of the invention, a second resist may be formed again on the first layer pattern on the first semiconductor substrate, removing the second resist pattern when a measured value is determined to be a prescribed value or more. Then, a new second resist pattern may be provided by exposing the new second resist using the second exposure apparatus with a correction value fed back. In this manner, a semiconductor device can be formed utilizing again the semiconductor wafer which has the second resist pattern determined to be defective. In another or still another aspect of the invention described above, the first exposure apparatus and the second exposure apparatus may be or may not be the same. Preferably the number of the measuring points of amounts of displacement is three or more.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
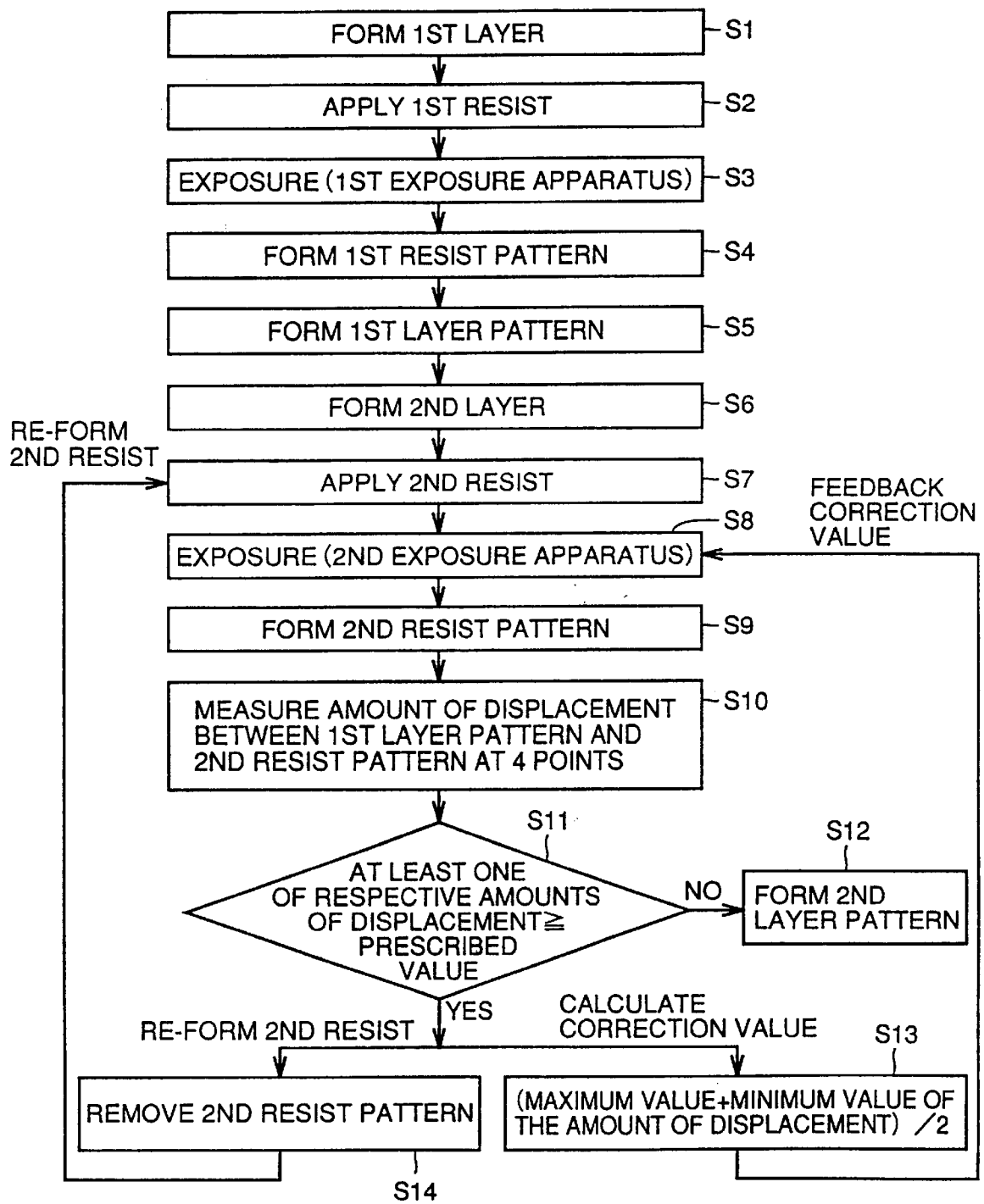
FIG. 1 is a flow chart showing a method of reducing a registration error according to an embodiment of the present invention.
Figure 2:
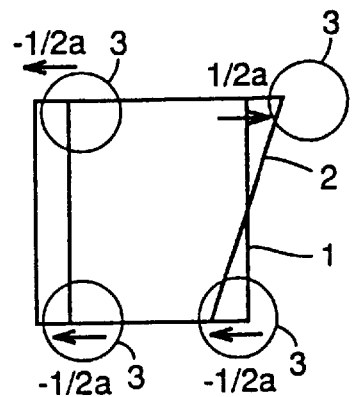
FIG. 2 is a schematic illustration of a result of an exposure by an exposure apparatus to which a correction value is fed back according to the method of reducing a registration error shown in FIG. 1.
Figure 3:
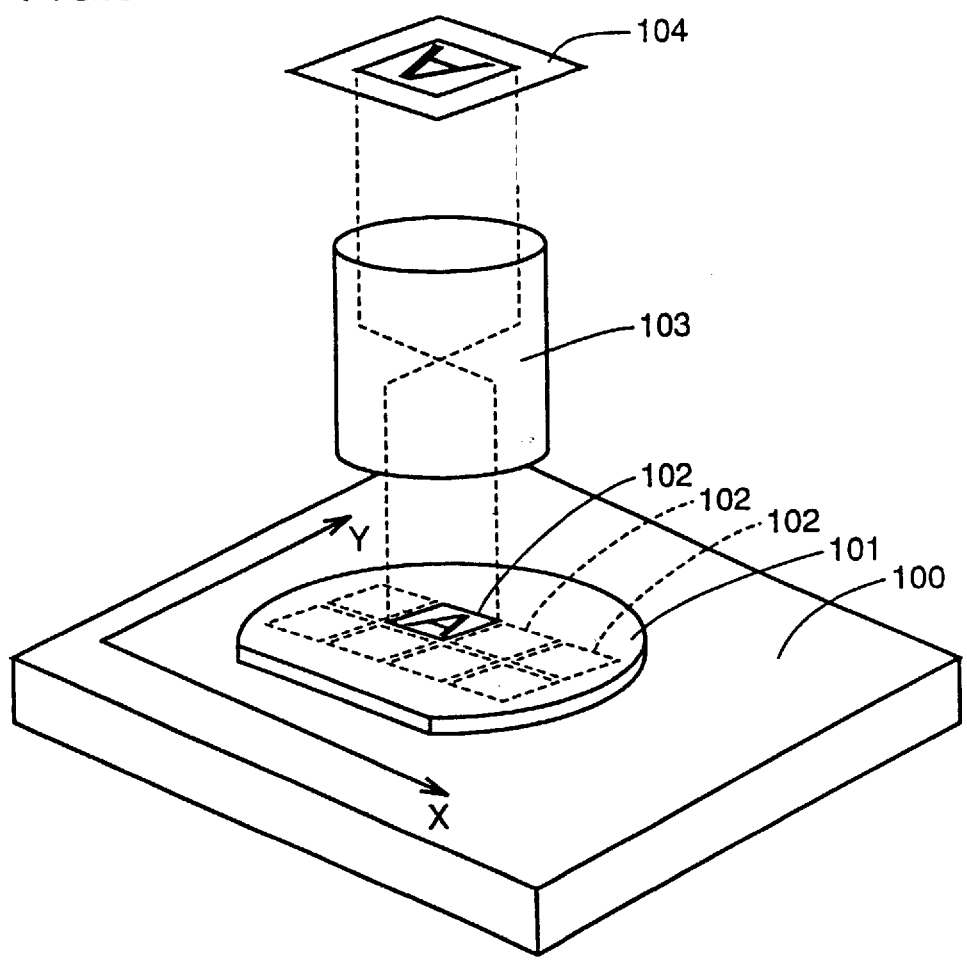
FIG. 3 is a perspective view illustrating a conventional exposure apparatus.
Figure 4:
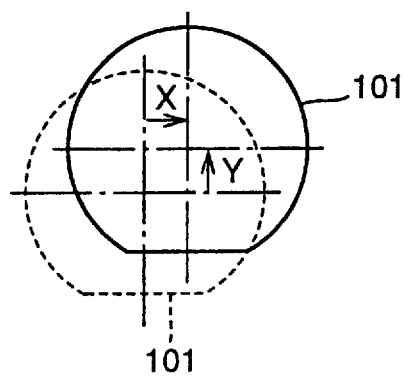
FIG. 4 is a schematic illustration of a result of a measurement of amounts of displacement (offset amounts).

Preferred embodiments of the present invention will be hereinafter described with reference to the drawings. FIG. 1 is a flow chart for showing a method of reducing a registration error according to a preferred embodiment of the invention. FIG. 2 is a schematic illustration of a state of misalignment after an exposure by a second exposure apparatus with the correction value fed back, shown in FIG. 1. First with reference to FIG. 1, a method of reducing a registration error according to this preferred embodiment will be described. The method of reducing a registration error in this embodiment shown in FIG. 1 is different from the conventional method shown in FIG. 5 in the manner of calculating a correction value.

As shown specifically in FIG. 1, a characteristic of this embodiment is to calculate, in S13, a correction value as one half the sum of the maximum and the minimum values of amounts of displacement at four points. Now, the method of reducing a registration error according to this embodiment will be described following the flow of FIG. 1.

A first layer is formed on a semiconductor substrate (not shown) in S1. A first resist is then applied to the first layer in S2. In S3, a first resist pattern shown in S4 is formed by exposing the first resist using a first exposure apparatus. The first resist pattern is provided such that it has a plurality of first misalignment inspection marks.

A first layer pattern in S5 is formed by patterning the lower first layer with the first resist pattern as a mask through etching or the like. The first misalignment inspection marks of the first resist pattern are transferred to the first layer pattern. The first resist pattern is removed after the formation of the first layer pattern. Next, a second layer is formed on the first layer pattern in S6. Second resist is applied to the second layer in S7. In S8, a second resist pattern in S9 is formed by exposing the second resist utilizing a second exposure apparatus. The second resist pattern is provided such that it has a plurality of second misalignment inspection marks corresponding to the plurality of first misalignment inspection marks.

Thereafter, amounts of displacement between the first layer pattern and the second resist pattern are measured at four points using the first and the second misalignment inspection marks in S10. In S11, a determination is made whether at least one of those amounts of displacement is a prescribed value or more. If all amounts of displacement are smaller than the prescribed value, it is determined that no correction of exposure apparatus is required, then a second layer pattern in S12 is formed by patterning the second layer using the second resist pattern as a mask through such as etching. On the other hand, if at least one of absolute values of the amounts of displacement is determined to be the prescribed value or more in S11, a correction value is calculated in S13, the resist is removed, and then second resist is formed again in S14.

In a method of calculating a correction value shown in S13 according to this embodiment, a correction value is calculated as one half the sum of the maximum and the minimum values of the amounts of displacement at four points. The calculated correction value is fed back to the second exposure apparatus in S8. In S14, the second resist pattern is removed and then new second resist is applied in S7.

Figure 6:
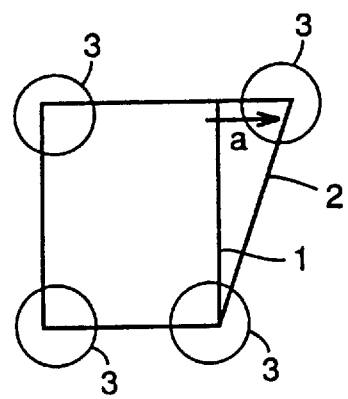
FIG. 6 is a schematic illustration of a state of misalignment after exposures by different exposure apparatuses according to a conventional method.
Figure 7:
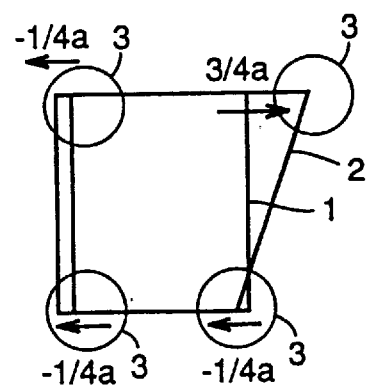
FIG. 7 is a schematic illustration of a result of an exposure by an exposure apparatus, after correcting the state of misalignment shown in FIG. 6 according to a conventional method for reducing amount of displacement.

By calculating a correction value for the misalignment between the first layer pattern 1 and the second resist pattern 2 in FIG. 6 in accordance with above described calculating method of a correction value, the following result will be provided. If one half the sum of the maximum and the minimum values of the measurements at the four corners in a shot is used as an amount of displacement of the shot shown in FIG. 6, the amount of displacement of the shot is (a+0)×½=a/2. The correction value is accordingly a/2, and the result of an exposure by the second exposure apparatus with the correction value fed back is shown in FIG. 2.

Figure 5:
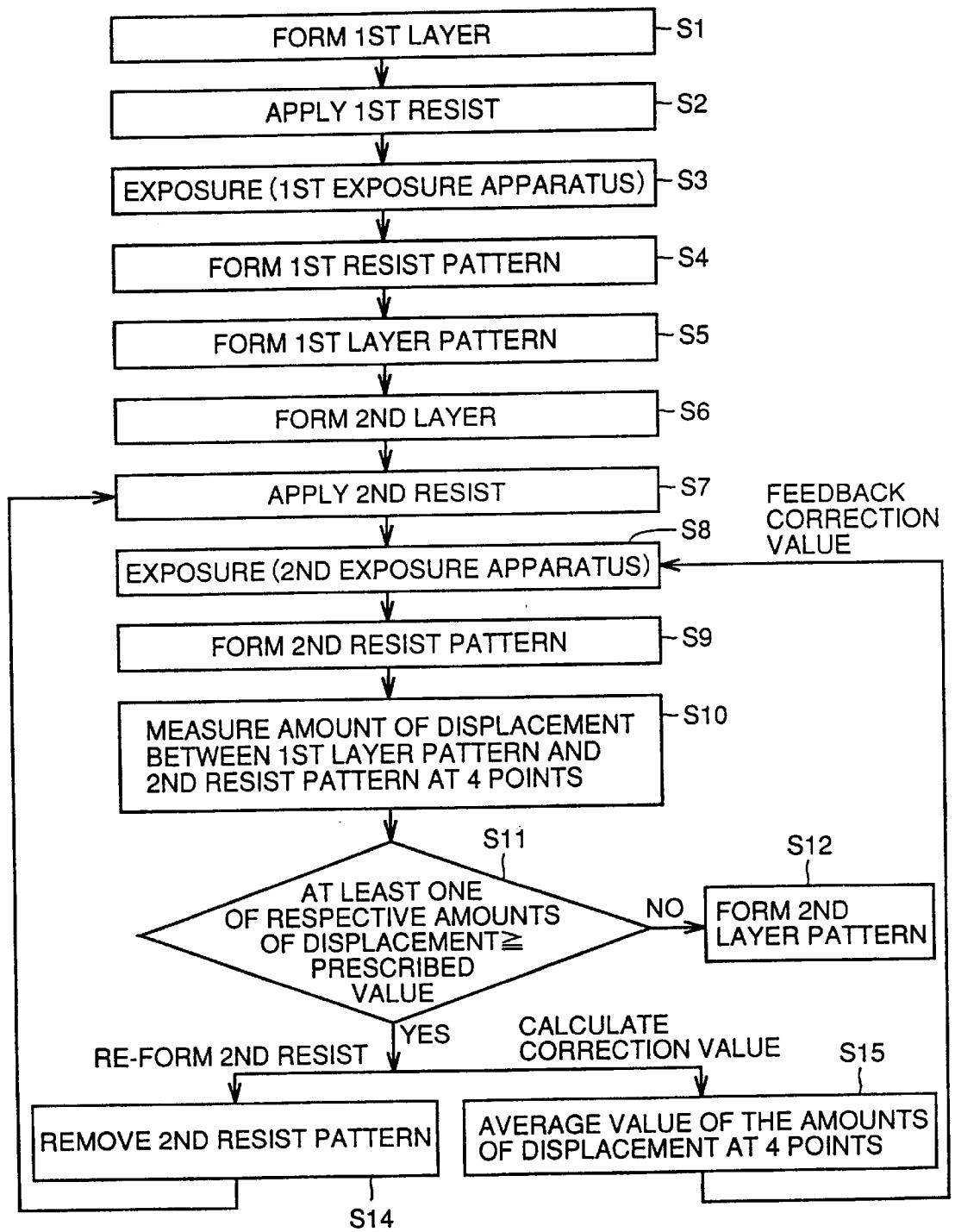
FIG. 5 is a flow chart showing a conventional method of reducing a registration error.

Referring to FIG. 2, an amount of displacement of the shot, one half the sum of the maximum and the minimum values of the measurements at four corners in the shot is (a/2−a/2)×½=0. Further, amounts of displacement at respective measuring points 3 in the shot are −a/2, −a/2, −a/2, +a/2. Thus the maximum absolute value of the amounts of displacement can be reduced to a/2 in this embodiment, while that of the amount of displacement according to the conventional method shown in FIG. 5 is still 3a/4. It is recognized that the amounts of displacement at four measuring points 3 are averaged. A shift in the Y direction is corrected similarly. Thus in this method of the preferred embodiment, a large amount of displacement at one point in a shot is effectively prevented, since amounts of displacement are distributed over the entire shot. As a result, such a disadvantage as an electrical short caused due to a shift of pattern of a contact hole, when, for example, a large amount of displacement occurs at one point in a shot, can be effectively avoided.

It is noted that the flow chart shown in FIG. 1 illustrates a flow in which if at least one of the absolute values of the amounts of displacement is determined to be a prescribed value or more in S11, the second resist pattern is removed in S14 and second resist is formed again in S7. That is the flow where the second exposure apparatus is used which has not received the feed back of a correction value. If the second exposure apparatus to which a correction value is fed back is used for an exposure, it is not likely that any of the amounts of displacement is determined to be a prescribed value or more in S11, thus a formation of a second layer pattern is proceeded in S12. In this case, the calculation of a correction value in S13 and the removal of the second resist pattern in S14 are not executed.

It is also noted that while the amounts of displacement are measured at four points in this embodiment, a similar effect can be obtained if the number of points are three or more according to the invention. According to the preferred embodiment shown in FIG. 1, although the exposure in S3 is performed using the first exposure apparatus and the exposure in S8 is executed using the second exposure apparatus, a single exposure apparatus may be used for the exposures of S3 and S8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of reducing a registration error in an exposure step during manufacturing a semiconductor device, comprising the steps of:

calculating one half the sum of maximum and minimum values of amounts of displacement measured at a plurality of measuring points to obtain a correction value; and using said correction value as a correction value for an exposure condition setting file within an exposure apparatus employed in said exposure step.

2. The method of reducing a registration error according to claim 1, wherein measuring points of said amounts of displacement is three or more in number.

* * * * *